US012666780B2

(12) United States Patent
Cheng et al.

(10) Patent No.: US 12,666,780 B2
(45) Date of Patent: Jun. 23, 2026

(54) ARRAY SUBSTRATE, DISPLAY PANEL, AND MANUFACTURING METHOD THEREOF

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Leilei Cheng, Beijing (CN); Cheng Xu, Beijing (CN); Jie Liu, Beijing (CN); Bin Zhou, Beijing (CN); Liangchen Yan, Beijing (CN); Haitao Wang, Beijing (CN); Ao Sheng, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 376 days.

(21) Appl. No.: 18/262,456

(22) PCT Filed: Sep. 29, 2022

(86) PCT No.: PCT/CN2022/122440
§ 371 (c)(1),
(2) Date: Jul. 21, 2023

(87) PCT Pub. No.: WO2024/065358
PCT Pub. Date: Apr. 4, 2024

(65) Prior Publication Data
US 2024/0395852 A1      Nov. 28, 2024

(51) Int. Cl.
*H10H 29/14* (2025.01)
*H10H 20/01* (2025.01)
(Continued)

(52) U.S. Cl.
CPC .......... *H10H 29/142* (2025.01); *H10H 20/01* (2025.01); *H10H 20/822* (2025.01); *H10H 20/84* (2025.01); *H10H 20/034* (2025.01)

(58) Field of Classification Search
CPC ...... H10H 20/01; H10H 20/822; H10H 20/84; H10H 20/034; H10H 20/00-882;
(Continued)

(56) References Cited

U.S. PATENT DOCUMENTS

2013/0026475 A1    1/2013   Choi et al.
2017/0278977 A1    9/2017   Jeong et al.
(Continued)

FOREIGN PATENT DOCUMENTS

CN      102903857 A      1/2013
CN      109901338 A      12/2014
(Continued)

*Primary Examiner* — Shahed Ahmed
(74) *Attorney, Agent, or Firm* — Davé Law Group, LLC; Raj S. Davé

(57) ABSTRACT

Embodiments of the present disclosure provide an array substrate and a related display panel and a method of manufacturing thereof. An array substrate comprises: a substrate; a first light-shielding layer; a first dielectric layer which comprises a first opening; a transistor, which comprises an active layer with a first source/drain region, a second source/drain region, and a channel region; a second dielectric layer, which comprises a second opening, wherein a second projection of the second opening on the substrate at least partially overlaps with a first projection of the first opening on the substrate; a first conductive layer; a third dielectric layer, which comprises a third opening, wherein a third projection of the third dielectric layer on the substrate at least partially overlaps with the first projection and the second projection; a fourth dielectric layer, which comprises a fourth opening, wherein a fourth projection of the fourth dielectric layer on the substrate at least partially overlaps (Continued)

with the first projection of the first opening, the second projection of the second opening, and the third projection of the third opening; and a second conductive layer.

20 Claims, 6 Drawing Sheets

(51) Int. Cl.
　　*H10H 20/822*　　　(2025.01)
　　*H10H 20/84*　　　(2025.01)
(58) Field of Classification Search
　　CPC ... H10H 29/00–142; H10H 29/30–962; H10K
　　　　59/12; H10K 59/10–221; H01L 23/481
　　See application file for complete search history.

(56) References Cited

U.S. PATENT DOCUMENTS

| | | | |
|---|---|---|---|
| 2019/0363151 | A1 | 11/2019 | Kim et al. |
| 2020/0006406 | A1 | 1/2020 | Song et al. |
| 2020/0083604 | A1 | 3/2020 | Misaki |
| 2020/0105789 | A1 | 4/2020 | Fang et al. |
| 2020/0251545 | A1 | 8/2020 | Liu et al. |
| 2023/0189564 | A1* | 6/2023 | Zhang ................. H10D 86/441 |
| | | | 257/71 |
| 2023/0329046 | A1* | 10/2023 | Kim ..................... H10D 86/481 |
| 2023/0329047 | A1* | 10/2023 | Chang ................. H10D 86/441 |

FOREIGN PATENT DOCUMENTS

| | | |
|---|---|---|
| CN | 104934449 A | 9/2015 |
| CN | 107004617 A | 8/2017 |
| CN | 107230689 A | 10/2017 |
| CN | 108878449 A | 11/2018 |
| CN | 109300917 A | 2/2019 |
| CN | 109755285 A | 5/2019 |
| CN | 114784071 A | 6/2019 |
| CN | 110050351 A | 7/2019 |
| CN | 110875363 A | 3/2020 |
| CN | 112968034 A | 6/2021 |
| KR | 20160056390 A | 5/2016 |

* cited by examiner

| Providing a substrate | S110 |
| Forming a first light-shielding layer | S120 |
| Forming a first dielectric layer | S130 |
| Forming a transistor | S140 |
| Forming a second dielectric layer | S150 |
| Forming a first conductive layer | S160 |
| Forming a third dielectric layer | S170 |
| Forming a fourth dielectric layer | S180 |
| Forming a second conductive layer | S190 |

ARRAY SUBSTRATE, DISPLAY PANEL, AND MANUFACTURING METHOD THEREOF

CROSS-REFERENCE TO RELATED APPLICATIONS

This patent application is a National Stage Entry of PCT/CN2022/122440 filed on Sep. 29, 2022, the disclosure of which is incorporated by reference herein in its entirety as part of the present application.

TECHNICAL FIELD

Embodiments of the present disclosure relate to the field of display technology, and particularly, to an array substrate, a display panel, and a manufacturing method thereof.

BACKGROUND

Organic Light-Emitting Diode (OLED) display panels have the advantages of self-illumination, high efficiency, bright colors, thinness and power saving, flexibility and wide operating temperature range, etc., and have been gradually used in large-area display, lighting and automotive display.

SUMMARY

Embodiments of the present disclosure provide an array substrate and a related display panel and a method of manufacturing the array substrate.

A first aspect of the present disclosure provides an array substrate. The array substrate including a substrate. The array substrate further includes a first light-shielding layer, a first dielectric layer, a transistor, a second dielectric layer, a first conductive layer, a third dielectric layer, a fourth dielectric layer, and a second conductive layer. The first light-shielding layer is disposed on the substrate. The first dielectric layer is disposed on the first light-shielding layer. The first dielectric layer includes a first opening exposing a portion of the first light-shielding layer. The transistor is disposed on the first dielectric layer. The transistor includes an active layer. The active layer includes a first source/drain region, a second source/drain region, and a channel region located between the first source/drain region and the second source/drain region. The second dielectric layer is disposed on the first dielectric layer and the transistor. The second dielectric layer includes a second opening. The second opening exposes the portion of the first light-shielding layer and the first source/drain region of the transistor. A second projection of the second opening on the substrate at least partially overlaps with a first projection of the first opening on the substrate. The first conductive layer is disposed on the second dielectric layer. The first conductive layer includes a first portion. The first portion covers the first opening and the second opening, and contacts the source/drain region of the active layer and the first light-shielding layer. The third dielectric layer is disposed on the first conductive layer. The third dielectric layer includes a third opening. The third opening exposes the first portion of the first conductive layer. A third projection of the third opening on the substrate at least partially overlaps with the first projection and the second projection. The fourth dielectric layer is disposed on the third dielectric layer. The fourth dielectric layer includes a fourth opening. The fourth opening exposes the first portion of the first conductive layer. A fourth projection of the fourth opening on the substrate at least partially overlaps with the first projection of the first opening, the second projection of the second opening, and the third projection of the third opening. The second conductive layer is disposed on the fourth dielectric layer and covers the third opening and the fourth opening, and contacts the first portion of the first conductive layer.

In an embodiment of the present disclosure, the second dielectric layer may further include a fifth opening. The fifth opening may expose the second source/drain region of the active layer.

In an embodiment of the present disclosure, the first conductive layer may further include a second portion. The second portion may cover the second opening, and contact the second source/drain region of the active layer.

In an embodiment of the present disclosure, the transistor may further include a gate insulating layer located on the active layer and a gate layer located on the gate insulating layer.

In an embodiment of the present disclosure, the gate layer and the gate insulating layer may be located on a side of the active layer away from the substrate.

In an embodiment of the present disclosure, the active layer may include an exposed portion located between the first portion of the first conductive layer and the gate layer along a direction parallel to the substrate. The array substrate may further include a second light-shielding layer. The second light-shielding layer may be disposed between the third dielectric layer and the fourth dielectric layer. A projection of the exposed portion of the active layer on the substrate may at least partially overlap with a projection of the second light-shielding layer on the substrate.

In an embodiment of the present disclosure, the second light-shielding layer may include a color film layer.

In an embodiment of the present disclosure, the color film layer may include a red color film layer.

In an embodiment of the present disclosure, the first light-shielding layer may be a metal layer.

In an embodiment of the present disclosure, the first dielectric layer may be a buffer layer, the second dielectric layer may be an interlayer dielectric layer, the third dielectric layer may be a passivation layer, and the fourth dielectric layer may be a pixel defining layer.

In an embodiment of the present disclosure, the active layer may include an indium gallium zinc oxide material.

In an embodiment of the present disclosure, the second conductive layer may include an anode layer of a light-emitting device.

A second aspect of the present disclosure provides a display panel. The display panel includes the array substrate according to any one of the first aspect.

A third aspect of the present disclosure provides a method of manufacturing an array substrate. The method includes: providing a substrate; forming a first light-shielding layer on the substrate; forming a first dielectric layer on the first light-shielding layer, wherein the first dielectric layer includes a first opening exposing a portion of the first light-shielding layer; forming a transistor on the first dielectric layer, wherein the transistor includes an active layer comprising a first source/drain region, a second source/drain region, and a channel region located between the first source/drain region and the second source/drain region; forming a second dielectric layer on the first dielectric layer and the transistor, wherein the second dielectric layer includes a second opening exposing the portion of the first light-shielding layer and the first source/drain region of the transistor, and a second projection of the second opening on the substrate at least partially overlaps with a first projection of the first opening on the substrate; forming a first conductive layer on the second dielectric layer, wherein the first conductive layer includes a first portion covering the first opening and the second opening, and contacting the source/drain region of the active layer and the first light-shielding layer; forming a third dielectric layer on the first conductive layer, wherein the third dielectric layer includes a third opening exposing the first portion of the first conductive layer, and a third projection of the third opening on the substrate at least partially overlaps with the first projection and the second projection; forming a fourth dielectric layer on the third dielectric layer, wherein the fourth dielectric layer includes a fourth opening, exposing the first portion of the first conductive layer, and a fourth projection of the fourth opening on the substrate at least partially overlaps with the first projection of the first opening, the second projection of the second opening, and the third projection of the third opening; and forming a second conductive layer on the fourth dielectric layer, wherein the second conductive layer covers the third opening and the fourth opening, and contacts the first portion of the first conductive layer.

In an embodiment of the present disclosure, the second dielectric layer may further include a fifth opening. The fifth opening may expose the second source/drain region of the active layer.

In an embodiment of the present disclosure, the first conductive layer may further include a second portion. The second portion may cover the second opening, and contact the second source/drain region of the active layer.

In an embodiment of the present disclosure, forming the transistor may include forming a gate insulating layer located on the active layer and a gate layer located on the gate insulating layer. The gate layer and the gate insulating layer may be located on a side of the active layer away from the substrate.

In an embodiment of the present disclosure, the active layer may include an exposed portion located between the first portion of the first conductive layer and the gate layer along a direction parallel to the substrate. The method may further include: forming a second light-shielding layer between the third dielectric layer and the fourth dielectric layer, and a projection of the exposed portion of the active layer on the substrate may at least partially overlaps with a projection of the second light-shielding layer on the substrate.

In an embodiment of the present disclosure, the second light-shielding layer may include a red color film layer.

In an embodiment of the present disclosure, the first light-shielding layer may be a metal layer. The first dielectric layer may be a buffer layer, the second dielectric layer may be an interlayer dielectric layer, the third dielectric layer may be a passivation layer, and the fourth dielectric layer may be a pixel defining layer. The active layer may include an indium gallium zinc oxide material. The second conductive layer may include an anode layer of a light-emitting device.

Further aspects and embodiments of adaptability will become apparent from the description provided herein. It should be understood that various aspects of the present application may be implemented individually or in combination with one or more other aspects. It should also be understood that the description and specific embodiments provided herein are intended for purposes of illustration only and are not intended to limit the scope of the present application.

BRIEF DESCRIPTION OF THE DRAWINGS

The drawings described herein are only for illustrative purposes of the selected embodiments, not all possible embodiments, and are not intended to limit the scope of the present application. In the drawings.

Corresponding reference numerals indicate corresponding parts or features throughout the several diagrams of the accompanying drawings.

DETAILED DESCRIPTION

Figure 1:
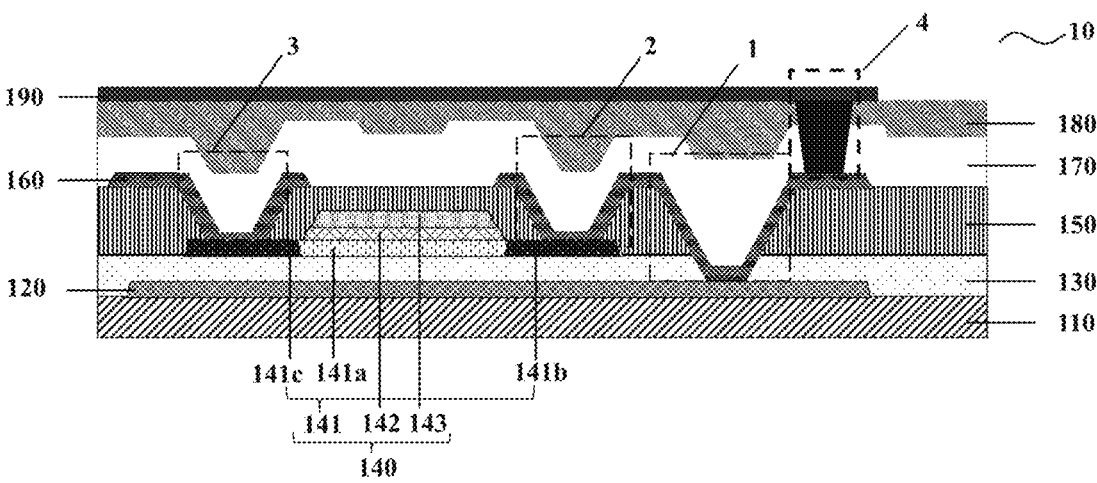
FIG. 1 shows a cross-sectional view of an array substrate.

Firstly, unless otherwise explicitly defined, it should be noted that the singular form of the words used in the specification and appended claims may include the plural form, and vice versa. Thus, when a term is mentioned in the singular form, it usually includes the plural form. Similarly, the words "include" and "comprise" will be interpreted as inclusive rather than exclusive. Likewise, the terms "comprise" and "or" should be interpreted as inclusive unless otherwise defined herein. Where the term "example" is used herein, and particularly following a group of terms, it is merely exemplary and illustrative and should not be considered as exclusive or extensive.

In addition, it should also be noted that, when elements of the present application and its embodiments are introduced, articles "a/an", "one", "that" and "the/said" are intended to indicate the presence of one or more elements; unless otherwise specified, "a plurality of" means two or more; the expressions "comprise", "include", "contain" and "have" are intended as inclusive and mean that there may be other elements besides those elements listed; the terms "first", "second", "third" and the like are just used for the purposes of description, and should not be understood as indicating or implying any relative importance or formation order.

In addition, the thickness and area of each layer in the drawings are exaggerated for clarity. It should be understood that when a layer, a region, or a component is referred to as being "on" another part, it means that it is directly on the other part, or there may be another component therebetween. In contrast, when a component is referred to as being "directly" on another component, it means that there is no other components therebetween.

The exemplary embodiments will now be more fully described with reference to the accompanying drawings.

FIG. 1 shows a cross-sectional view of an array substrate. As shown in FIG. 1, the array substrate 10 of a related art comprises a substrate 110, and a light-shielding layer 120, a buffer layer 130, a transistor 140 (for example, a driving transistor), an interlayer dielectric layer 150, a source/drain layer 160, a passivation layer 170, a planarization layer 180, and an electrode layer 190, such as an anode layer of a light-emitting device stacked in sequence on the substrate 110. In FIG. 1, the source/drain layer 160 is in contact with the light-shielding layer 120 via a hole 1. The hole 1 comprises a portion passing through the buffer layer 130 and a portion passing through the interlayer dielectric layer 150. Generally, the projections of the portion passing through the buffer layer 130 and the portion passing through the interlayer dielectric layer 150 on the substrate 110 at least partially overlap or the projection of the portion passing through the buffer layer 130 is completely within the projection of the portion passing through the interlayer dielectric layer 150. In the latter case, the hole also referred to as an overlapping hole. The source/drain layer 160 is also in contact with different source/drain regions (140b and 140c) of the transistor 140 via hole 2 and hole 3, respectively. The anode layer 190 of the light-emitting device is in contact with the source/drain layer 160 via hole 4. The hole 4 comprises a portion passing through the passivation layer 170 and a portion passing through the planarization layer 180. Similar to the hole 1, the hole 4 is also an overlapping hole. As shown in FIG. 1, the projections of the hole 1, the hole 2, and the hole 4, which are used for the same electrical connection, on the substrate 110 do not overlap. This limits the further reduction of the area of the non-display region, thereby limiting the aperture ratio of the related display panel or display device.

In order to solve this technical problem, and further improve the aperture ratio, the present disclosure provides the array substrate, which reduces the area for forming holes by at least partially overlapping the projections of the hole 1, the hole 2, and the hole 4 on the substrate 110, thereby increasing the opening area of pixels and increasing the aperture ratio.

Figure 2:
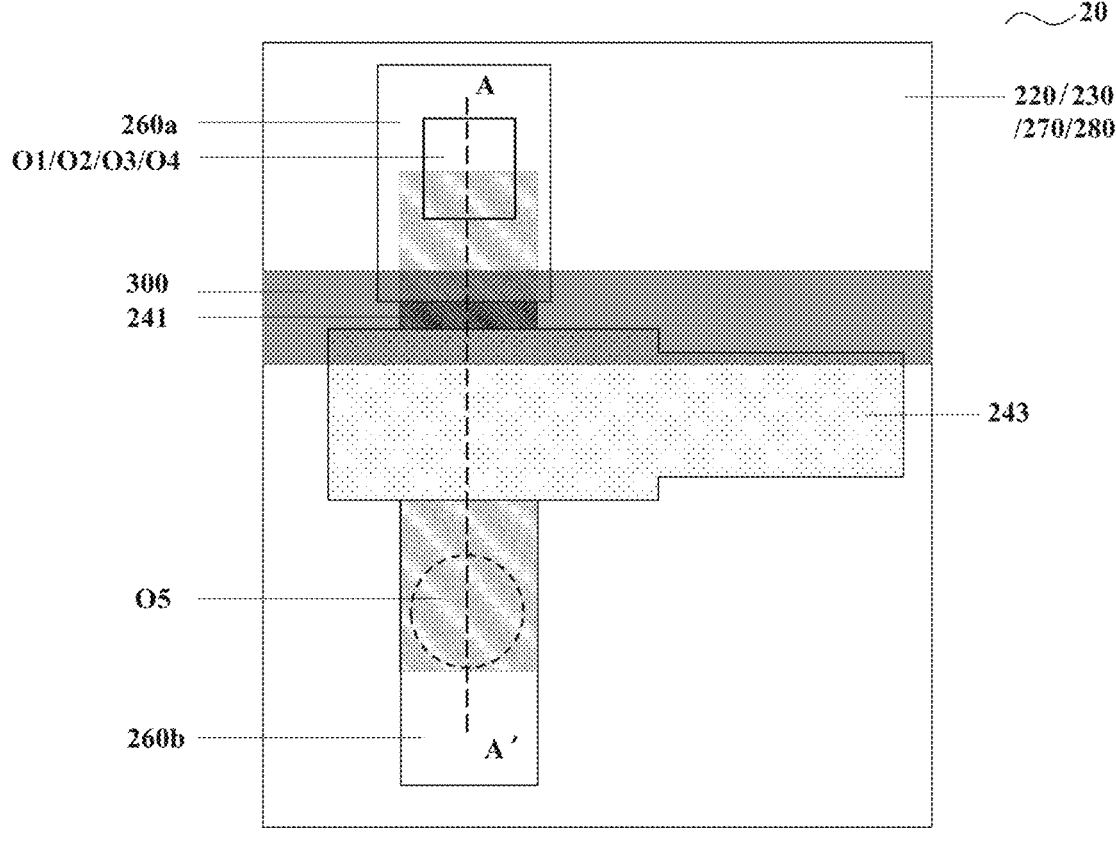
FIG. 2 schematically shows a top view of the array substrate according to an embodiment of the present disclosure.
Figure 3:
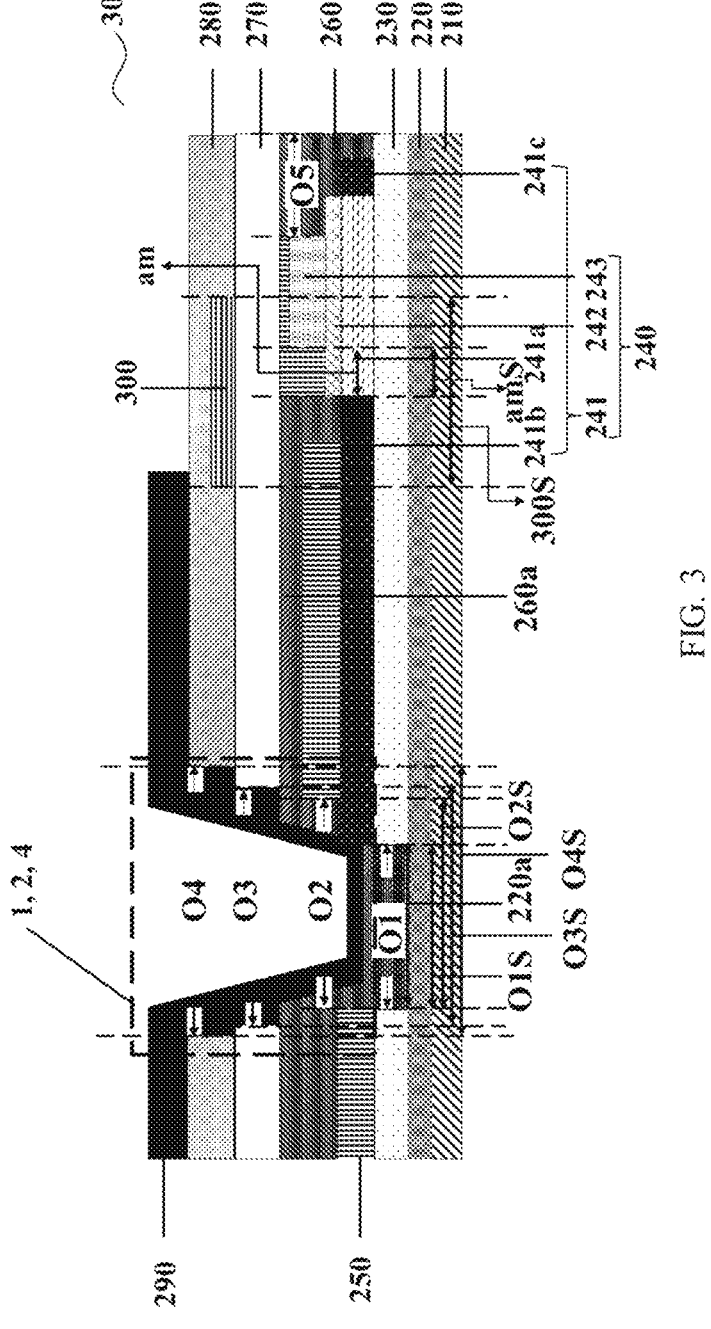
FIG. 3 schematically shows a cross-sectional view of the array substrate taken along line AA' in FIG. 2 according to an embodiment of the present disclosure.

FIG. 2 schematically shows a top view of the array substrate according to an embodiment of the present disclosure. FIG. 3 schematically shows a schematic cross-sectional view of the array substrate taken along line AA' in FIG. 2 according to an embodiment of the present disclosure. In the embodiment of the present disclosure, the array substrate 20 comprises a substrate 210, a first light-shielding layer 220, a first dielectric layer 230, a transistor 240, a second dielectric layer 250, a first conductive layer 260, a third dielectric layer 270, a fourth dielectric layer 280, a second conductive layer 290 and a second light-shielding layer 300. For clarity, the substrate 210 and the second conductive layer 290 are not shown in FIG. 2. In the embodiment of the present disclosure, the first dielectric layer 230 has a first opening O1. The second dielectric layer 240 comprises a second opening O2 and a fifth opening O5. The third dielectric layer 270 comprises a third opening O3. The fourth dielectric layer 280 comprises a fourth opening O4. In the embodiment of the present disclosure, the second opening O2 at least partially overlaps with the first opening O1. The first opening O1, the second opening O2 and the third opening O3 are at least partially overlapped. Moreover, the first opening O1, the second opening O2, the third opening O3 and the fourth opening O4 are at least partially overlapped. In other words, the first opening O1, the second opening O2, the third opening O3 and the fourth opening O4 have a common overlapping portion. FIG. 3 only schematically shows the common overlapping portion of the first opening O1, the second opening O2, the third opening O3 and the fourth opening O4.

In an embodiment of the present disclosure, the substrate 210 may be rigid or flexible. The first light-shielding layer 220 is similar to the light-shielding layer 120 as shown in FIG. 1, and is disposed on the substrate 210. In an embodiment of the present disclosure, the first light-shielding layer 220 may comprise metal.

In the embodiment of the present disclosure, the first dielectric layer 230 is disposed on the first light-shielding layer 220. The first dielectric layer 230 comprises the first opening O1. As shown in FIG. 3, the first opening O1 passes through the first dielectric layer 230 and exposes the portion 220a of the first light-shielding layer 220. The first opening O1 has a first projection O1S on the substrate 210. As an example, the first opening O1 is adjacent to the first source/drain region 241b of the transistor 240 in a direction parallel to the substrate 210.

In the embodiment of the present disclosure, the transistor 240 is disposed on the first dielectric layer 230. In the embodiment of the present disclosure, the transistor 240 may be a driving transistor for supplying a driving current to the light-emitting device. The transistor 240 comprises an active layer 141, a gate insulating layer 142 and a gate layer 143. The active layer 141 comprises a first source/drain region 141b, a second source/drain region 141c and a channel region 141a. The channel region 141a is located between the first source/drain region 141b and the second source/drain region 141c. As an example, the active layer 141 comprises a silicon-based or oxide-based semiconductor material. In one embodiment of the present disclosure, the active layer 141 comprises an indium gallium zinc oxide material (IGZO). The first source/drain region 141b and the second source/drain region 141c may be conductorized. In an embodiment of the present disclosure, only the surface regions of the first source/drain region 141b and the second source/drain region 141c are conductorized. The gate insulating layer 142 is disposed on the active layer 141. The gate layer 143 is disposed on the gate insulating layer 142. In the embodiment of the present disclosure, setting A on B or A being set on B means that A is on one side of B away from the substrate. A portion of the active layer 241 within the projection of the gate layer 243 on the active layer 241 is the channel region 241a.

In the embodiment of the present disclosure, the second dielectric layer 250 is disposed on the first dielectric layer 230 and the transistor 240. In an embodiment of the present disclosure, the second dielectric layer 250 may comprise the interlayer dielectric layer. The second dielectric layer 250 comprises the second opening O2. As shown in FIG. 3, the second opening O2 penetrates the second dielectric layer 250 and is adjacent to the first source/drain region 241b of the transistor 240 in a direction parallel to the substrate 210. The second opening O2 has a second projection O2S on the substrate 210. The second projection O2S at least partially overlaps with the first projection O1S. In other words, the first opening O1 and the second opening O2 form a first overlapping hole. As an example, the first projection O1S falls completely within the second projection O2S. The second opening O2 exposes the portion 220a of the first light-shielding layer 220 and exposes the first source/drain region 241b of the transistor 240. In other embodiments of the present disclosure, the first projection O1S may completely overlap with the second projection O2S. Alternatively, a portion of the first projection O1S falls within the second projection OS2. Correspondingly, the second opening O2 may expose other portions of the first light-shielding layer 220, and the portions may comprise all or part of the portion 220a of the first light-shielding layer 220.

In addition, the second dielectric layer 250 further comprises the fifth opening O5. As shown in FIG. 3, the fifth opening O5 also penetrates the second dielectric layer 250 to expose the second source/drain region 241c. The fifth opening O5 is adjacent to the second source/drain region 241c of the transistor 240 in a direction parallel to the substrate 210.

In the embodiment of the present disclosure, the first conductive layer 260 is disposed on the second dielectric layer 250. In the embodiment of the present disclosure, the first conductive layer 260 may comprise a source/drain electrode layer of the transistor 240. As shown in FIG. 3, the first conductive layer 260 comprises a first portion 260a. The first portion 260a covers the first opening O1 and the second opening O2 and is in contact with the first source/drain region 241b of the active layer 241 and the first portion 220a of the first light-shielding layer 220 through the first dielectric layer 230 and the second dielectric layer 250. The first conductive layer 260 further comprises a second portion 260b. The second portion 260b is in contact with the first source/drain region 241b of the active layer 241 and the first light-shielding layer 220 through the first dielectric layer 230 and the second dielectric layer 250.

In the embodiment of the present disclosure, the third dielectric layer 270 is disposed on the first conductive layer 260. In the embodiment of the present disclosure, the third dielectric layer 270 may comprise the passivation layer, similar to the passivation layer 170 in FIG. 1. As shown in FIG. 3, the third dielectric layer 270 comprises a third opening O3. The third opening O3 penetrates the third dielectric layer 270 and exposes the first portion 260a of the first conductive layer 260. The third opening O3 is adjacent to the first source/drain region 241b of the transistor 240 in a direction parallel to the substrate 210. The third opening O3 has a third projection O3S on the substrate 210. The third projection OS3 at least partially overlaps with the first projection OS1 and the second projection OS2. In other words, the third projection OS3 at least partially overlaps with the projection of the first overlapping hole on the substrate. As an example, the first projection OS1 and the second projection OS2 fall completely within the third projection OS3. In other words, the projection of the first overlapping hole on the substrate falls completely within the third projection OS3. Alternatively, a part of the overlapping portion of the first projection OS1 and the second projection OS2 falls within the third projection O3S. In other words, the projection portion of the first overlapping hole on the substrate falls within the third projection OS3.

In the embodiment of the present disclosure, the second light-shielding layer 300 is disposed on the third dielectric layer 270. In an embodiment of the present disclosure, the second light-shielding layer 300 comprises a color film layer. As an example, the color film layer is a red color film layer. As shown in FIG. 3, the active layer 241 comprises an exposed portion am between the first portion 260a of the first conductive layer 260 and the gate layer 243 in a direction parallel to the substrate 210. The projection amS of the exposed portion am on the substrate 210 at least partially overlaps with the projection 300S of the second light-shielding layer 300 on the substrate 210. As an example, the projection amS of the exposed portion am on the substrate 210 completely falls within the projection 300S of the second light-shielding layer 300 on the substrate 210. In other embodiments of the present disclosure, the projection amS of the exposed portion am on the substrate 210 completely overlaps with the projection 300S of the second light-shielding layer 300 on the substrate 210. Alternatively, a part of the projection amS of the exposed portion am on the substrate 210 falls within the projection 300S of the second light-shielding layer 300 on the substrate 210.

In the embodiments of the present disclosure, the characteristic drift of an unshielded part (for example, the exposed portion) of the channel region caused by illuminating may be prevent by disposing the second light-shielding layer 300.

In the embodiment of the present disclosure, the fourth dielectric layer 280 is disposed on the third dielectric layer 270. Inan embodiment of the present disclosure, the fourth medium layer 280 may comprise a pixel defining layer. As shown in FIG. 3, the fourth dielectric layer 280 comprises a fourth opening O4. The fourth opening O4 penetrates the fourth dielectric layer 280 and is adjacent to the first source/drain region 241b of the transistor 240 in a direction parallel to the substrate 210. The fourth projection OS4 of the fourth opening O4 on the substrate 210 at least partially overlaps with the first projection OS1, the second projection OS2 and the third projection OS3. In other words, the third opening O3 and the fourth opening O4 form a second overlapping holes, and the projection of the second overlapping holes on the substrate at least overlaps with the projection of the first overlapping holes on the substrate. As an example, the overlapping portion of the first projection OS1, the second projection OS2 and the third projection OS3 falls completely within the fourth projection OS4. In other words, the projection of the first overlapping holes on the substrate 210 completely falls within the projection of the second overlapping holes on the substrate 210. Alternatively, a part of the overlapping portion of the first projection OS1, the second projection OS2 and the third projection OS3 falls within the third projection O3S. In other words, the projection of the first overlapping holes on the substrate 210 partially falls within the projection of the second overlapping holes on the substrate 210.

In the embodiment of the present disclosure, the second conductive layer 290 is disposed on the fourth dielectric layer 280. The second conductive layer 290 may comprise an electrode layer, such as an anode of the light-emitting device. As shown in FIG. 3, the second conductive layer 290 covers the third opening O3 and the fourth opening O4, and is in contact with the first portion 260a of the first conductive layer 260 through the third dielectric layer 270 and the fourth dielectric layer 280.

In an embodiment of the present disclosure, the projection of the first overlapping holes formed by the first opening O1 and the second opening O2 on the substrate at least partially overlaps with the projection of the second overlapping holes formed by the third opening O3 and the fourth opening O4 on the substrate. This may reduce the area for forming openings on the array substrate, thereby increasing the aperture ratio. As an example, the projection of the first overlapping holes on the substrate falls completely within the projection of the second overlapping holes on the substrate.

In the embodiment of the present disclosure, the array substrate may further comprise other material layers, for example, a second gate insulating layer, a second gate layer, and the like.

Embodiments of the present disclosure further provide a display panel comprising the array substrate 30 according to any embodiment of the present disclosure.

Figures 4, 5:
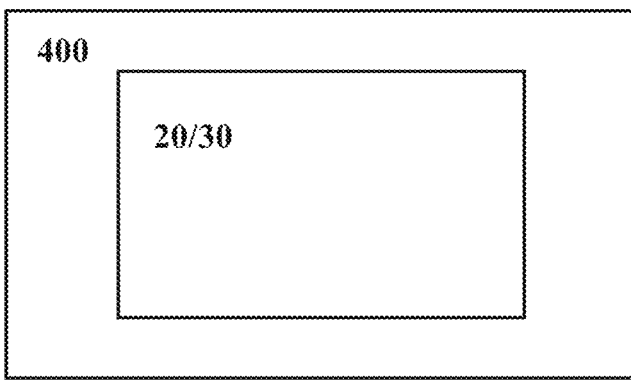
FIG. 4 shows a structural schematic diagram of a display panel according to an embodiment of the disclosure.
FIG. 5 shows a flowchart of a method of manufacturing the array substrate according to an embodiment of the present invention.

FIG. 4 shows a structural schematic diagram of the display panel according to an embodiment of the disclosure. As shown in FIG. 4, the display panel 400 may comprise the array substrate 30 according to any embodiment of the present disclosure.

For example, the display panel 400 may further comprise other components, such as a timing controller, a signal decoding circuit, a voltage conversion circuit, and the like, for example, which may adopt the conventional components, the detailed description of which will be omitted here.

For example, the display panel 400 may be a rectangular panel, a circular panel, an elliptical panel, or a polygonal panel. In addition, the display panel 400 may be not only a flat panel, but also a curved panel, or even a spherical panel. For example, the display panel 400 may further have a touch function, which means, the display panel 400 may be a touch display panel.

The display panel provided by the embodiment of the present disclosure has the same or similar beneficial effects as the array substrate provided by the embodiments of the present disclosure above. Since the array substrate has been described in detail in the embodiments above, it will not be repeated here.

Embodiments of the present disclosure further provide a method of manufacturing an array substrate. FIG. 5 shows a flowchart of a method of manufacturing an array substrate according to an embodiment of the present invention. The manufacturing method will be described in detail below with reference to FIG. 3 and FIG. 5 to FIG. 10.

FIG. 5 shows a flowchart of a method of manufacturing an array substrate according to an embodiment of the present invention. As shown in FIG. 5, at step S110, a substrate 210 is provided; at step S120, a first light-shielding layer 220 is formed on the substrate 210; at step S130, a first dielectric layer 230 is formed on the first light-shielding layer 220; at step S140, a transistor 240 is formed on the first dielectric layer 230; at step S150, a second dielectric layer 250 is formed on the first dielectric layer 230 and the transistor 240; at step S160, a first conductive layer 260 is formed on the second dielectric layer 250; at step S170, a third dielectric layer 270 is formed on the first conductive layer 260; at step S180, a fourth dielectric layer 280 is formed on the third dielectric layer 270; and, at step S190, a second conductive layer 290 is formed on the fourth dielectric layer 280. The above step S130 to step S190 will be described in more detail below with reference to the accompanying drawings.

Figure 6:
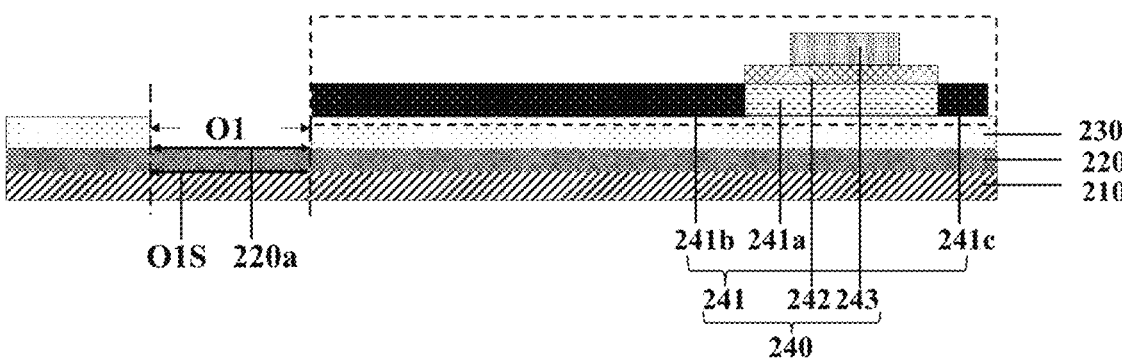
FIGS. 6-11 schematically show the manufacturing steps of the method of manufacturing the array substrate according to an embodiment of the present disclosure.

FIG. 6 shows manufacturing steps of the method of manufacturing the array substrate according to an embodiment of the present disclosure. As shown in FIG. 6, forming the first dielectric layer 230 further comprises forming a first opening O1 in the first dielectric layer 230. In the embodiment of the present disclosure, the first opening O1 is formed in the first dielectric layer 230 by an etching technique, such as a CNT (contact hole) technique. It should be understood that, in FIG. 6, the first opening O1 may be formed before or after forming the transistor 240. As shown in FIG. 6, the first opening O1 is adjacent to a first source/drain region 241*b* of the transistor 240 in a direction parallel to the substrate 210. The first opening O1 exposes a portion 220*a* of the first light-shielding layer 220.

Figure 7:
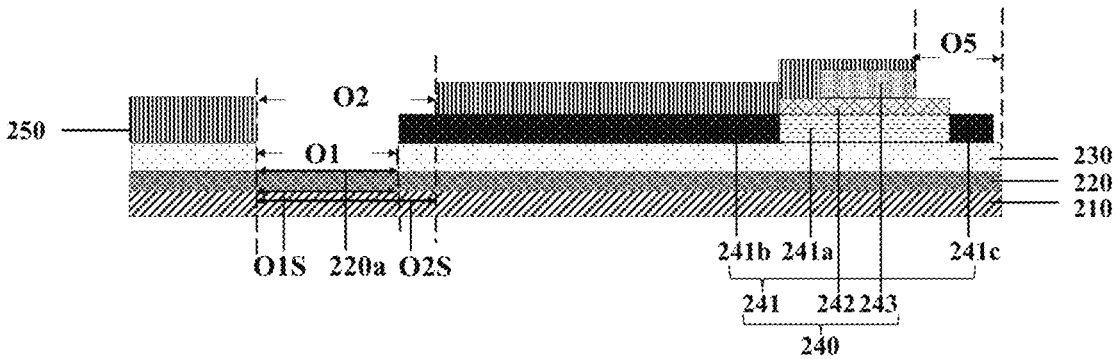

FIG. 7 shows manufacturing steps of the method of manufacturing the array substrate according to an embodiment of the present disclosure. As shown in FIG. 7, at step S140, forming the transistor 240 on the first dielectric layer 230 comprises: forming an active layer 241 on the first dielectric layer; forming a gate insulating layer 242 on the active layer 241; and forming a gate layer 243 on the gate insulating layer 242. In this embodiment, the active layer further comprises the first source/drain region 241*b* and a second source/drain region 241*c* located on both sides of the channel region 241*a*. In the embodiment of the present disclosure, the first source/drain region 241*b* and the second source/drain region 241*c* may be metalized. As an example, the gate insulating layer 242 and the gate layer 243 are formed on the side of the active layer 241 away from the substrate 210. In other embodiments of the present disclosure, the gate insulating layer 242 and the gate layer 243 may be formed on the side of the active layer 241 close to the substrate 210.

As shown in FIG. 7, at step S150, forming the second dielectric layer 250 further comprises: forming a second opening O2 and a fifth opening O5 in the second dielectric layer 250. As an example, the second opening O2 and the fifth opening O5 may be formed in the second dielectric layer 250 by an etching technique. As shown in FIG. 7, the second opening O2 is adjacent to the first source/drain region 241*b* of the transistor 240 in a direction parallel to the substrate 210. The fifth opening O5 is adjacent to the second source/drain region 241*c* of the transistor 240 in a direction parallel to the substrate 210. As an example, the second opening O2 exposes the entirety of the portion 220*a* of the first light-shielding layer 220 via the first opening O1. In other embodiments of the present disclosure, the second opening O2 exposes a part of the portion 220*a* of the first light-shielding layer 220. The fifth opening O5 exposes the second source/drain region 241*c* of the active layer 241.

In an embodiment of the present disclosure, the second opening O2 and the first opening O1 may be formed after the first dielectric layer 230 and the second dielectric layer 260 have been formed.

Figure 8:
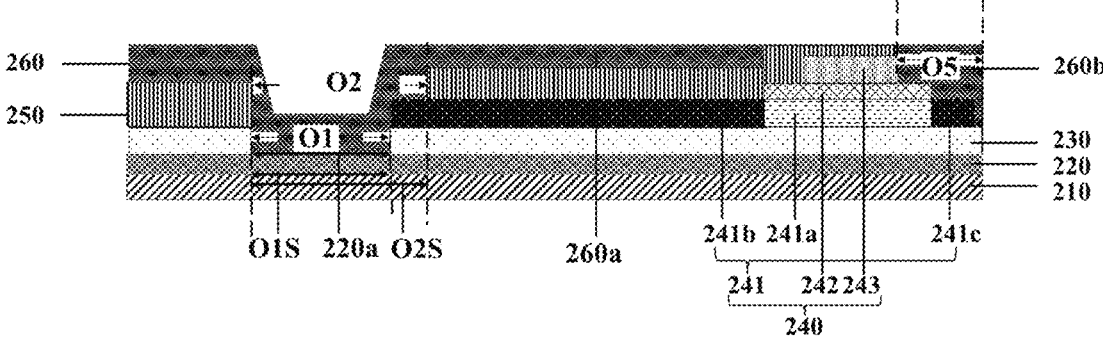

FIG. 8 shows manufacturing steps of the method of manufacturing the array substrate according to an embodiment of the present disclosure. As shown in FIG. 8, at step S160, forming the first conductive layer 260 on the second dielectric layer 250 comprises: forming the first conductive layer 260 to comprise a first portion 260*a* and a second portion 260*b*. The first portion 260*a* covers the first opening O1 and the second opening O2 and is in contact with the first source/drain region 241*b* of the active layer 241 and the first portion 220*a* of the first light-shielding layer 220. The second portion 260*b* covers the fifth opening O5 and contacts the second source/drain region 241*c* of the active layer 241.

Figure 9:
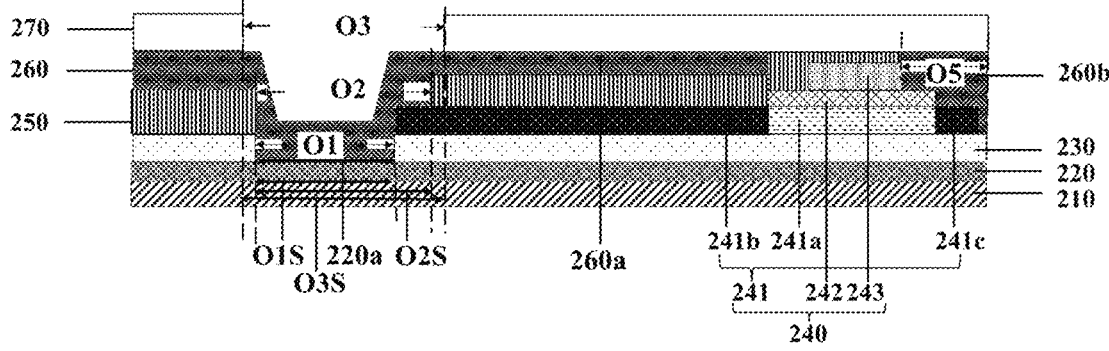

FIG. 9 shows manufacturing steps of the method of manufacturing the array substrate according to an embodiment of the present disclosure. As shown in FIG. 9, at step S170, the third dielectric layer 270 is formed on the first conductive layer 260, and a third opening O3 is formed in the third dielectric layer 270, for example, by etching. The third opening O3 is adjacent to the first source/drain region 241*b* of the transistor 240 in a direction parallel to the substrate 210. The third opening O3 exposes the first portion 260*a* of the first conductive layer 260.

Figure 11:
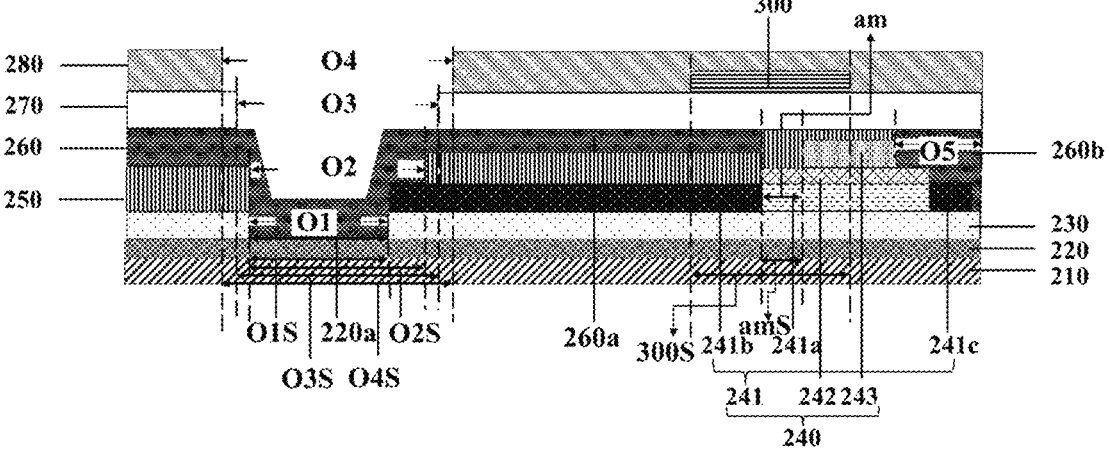

FIG. 11 shows manufacturing steps of the method of manufacturing the array substrate according to an embodiment of the present disclosure. As shown in FIG. 11, at step S180, forming the fourth dielectric layer 280 on the third dielectric layer 270 comprises: forming a fourth opening O4 in the fourth dielectric layer 280, for example, by etching. The fourth opening O4 is adjacent to the first source/drain region 241*b* of the transistor 240 in a direction parallel to the substrate 210. As an example, the fourth opening O4 exposes the entirety of the first portion 260*a* of the first conductive layer 260 via the third opening O3. In other embodiments of the present disclosure, the fourth opening O4 exposes a part of the entirety of the first portion 260*a* of the first conductive layer 260 via the third opening O3.

As shown in FIG. 3, at step S190, a second conductive layer 290 is formed on the fourth dielectric layer 280. The second conductive layer 290 covers the third opening O3 and the fourth opening O4 and is in contact with the first portion 260*a* of the first conductive layer 260.

In the embodiment of the present disclosure, the projection of an first overlapping hole formed by the first opening O1 and the second opening O2 on the substrate overlaps at least partially the projection of an second overlapping hole formed by the third opening O3 and the fourth opening O4 on the substrate. This can reduce the area for forming openings on the array substrate, thereby increasing the aperture ratio. As an example, the projection of the first overlapping hole on the substrate falls completely within the projection of the second overlapping hole on the substrate.

Additionally, the method of manufacturing the array substrate according to the present disclosure further comprises forming a second light-shielding layer 300 between the third dielectric layer 270 and the fourth dielectric layer 280. Specifically, as shown in FIG. 10, between step S170 and step S180, the second light-shielding layer 300 is formed on the array substrate 30 comprising the third dielectric layer 270.

Figure 10:
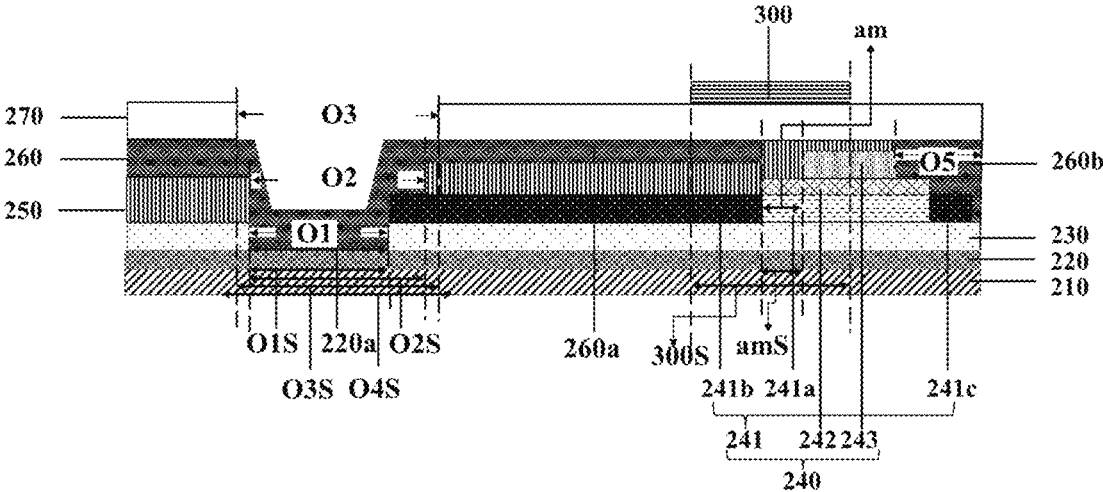

As shown in FIG. 10, the active layer 241 has an exposed portion am between the first portion 260a of the first conductive layer 260 and the gate layer 243 in a direction parallel to the substrate 210. The projection 300S of the second light-shielding layer 300 on the substrate 210 at least partially overlaps with the projection amS of the exposed portion am of the active layer 241 on the substrate 210.

In the embodiment of the present disclosure, b the characteristic drift of an unshielded part (for example, the exposed portion) of the channel region caused by illuminating may be prevent by disposing the second light-shielding layer 300.

It should be noted that the above method steps and sequence for manufacturing the array substrate are only illustrative. The method may be executed in the above order. Alternatively, the method may also be executed in other orders to meet specific requirements or for other purposes. In addition, the method may also comprise other additional steps.

The foregoing description of the embodiments has been provided for purposes of illustration and description. It is not intended to be exhaustive or to limit the present application. The various elements or features of a particular embodiment are generally not limited to the particular embodiment. However, under appropriate circumstances, such elements and features are interchangeable and may be used in selected embodiments, even if not specifically shown or described. Likewise, this may also be varied in many ways. Such changes are not to be considered a departure from the present application, and all such modifications are included within the scope of the present application.

What is claimed is:

1. An array substrate, comprising:
a substrate;
a first light-shielding layer disposed on the substrate;
a first dielectric layer disposed on the first light-shielding layer, wherein the first dielectric layer comprises a first opening exposing a portion of the first light-shielding layer;
a transistor disposed on the first dielectric layer, wherein the transistor comprises an active layer with a first source/drain region, a second source/drain region, and a channel region located between the first source/drain region and the second source/drain region;
a second dielectric layer disposed on the first dielectric layer and the transistor, wherein the second dielectric layer comprises a second opening exposing the portion of the first light-shielding layer and the first source/drain region of the transistor, and wherein a second projection of the second opening on the substrate at least partially overlaps with a first projection of the first opening on the substrate;

a first conductive layer disposed on the second dielectric layer, wherein the first conductive layer comprises a first portion covering the first opening and the second opening, and contacting the source/drain region of the active layer and the first light-shielding layer;
a third dielectric layer disposed on the first conductive layer, wherein the third dielectric layer comprises a third opening exposing the first portion of the first conductive layer, and wherein a third projection of the third opening on the substrate at least partially overlaps with the first projection and the second projection;
a fourth dielectric layer disposed on the third dielectric layer, wherein the fourth dielectric layer comprises fourth opening exposing the first portion of the first conductive layer, and wherein a fourth projection of the fourth opening on the substrate at least partially overlaps with the first projection of the first opening, the second projection of the second opening, and the third projection of the third opening; and
a second conductive layer disposed on the fourth dielectric layer, wherein the second conductive layer covers the third opening and the fourth opening, and contacts the first portion of the first conductive layer.

2. The array substrate according to claim 1, wherein the second dielectric layer further comprises a fifth opening exposing the second source/drain region of the active layer.

3. The array substrate according to claim 2, wherein the first conductive layer further comprises a second portion covering the second opening, and contacting the second source/drain region of the active layer.

4. The array substrate according to claim 3, wherein the transistor further comprises a gate insulating layer located on the active layer and a gate layer located on the gate insulating layer.

5. The array substrate according to claim 4, wherein the gate layer and the gate insulating layer are located on a side of the active layer away from the substrate.

6. The array substrate according to claim 5, wherein the active layer comprises an exposed portion located between the first portion of the first conductive layer and the gate layer along a direction parallel to the substrate, the array substrate further comprises a second light-shielding layer disposed between the third dielectric layer and the fourth dielectric layer, and a projection of the exposed portion of the active layer on the substrate at least partially overlaps with a projection of the second light-shielding layer on the substrate.

7. The array substrate according to claim 6, wherein the second light-shielding layer comprises a color film layer.

8. The array substrate according to claim 7, wherein the color film layer comprises a red color film layer.

9. The array substrate according to claim 1, wherein the first light-shielding layer is a metal layer.

10. The array substrate according to claim 1, wherein the first dielectric layer is a buffer layer, the second dielectric layer is an interlayer dielectric layer, the third dielectric layer is a passivation layer, and the fourth dielectric layer is a pixel defining layer.

11. The array substrate according to claim 1, wherein the active layer comprises an indium gallium zinc oxide material.

12. The array substrate according to claim 1, wherein the second conductive layer comprises an anode layer of a light-emitting device.

13. A display panel, comprising the array substrate according to claim 1.

14. A method of manufacturing an array substrate, comprising:

providing a substrate;

forming a first light-shielding layer on the substrate;

forming a first dielectric layer on the first light-shielding layer, wherein the first dielectric layer comprises a first opening exposing a portion of the first light-shielding layer;

forming a transistor on the first dielectric layer, wherein the transistor comprises an active layer comprising a first source/drain region, a second source/drain region, and a channel region located between the first source/drain region and the second source/drain region;

forming a second dielectric layer on the first dielectric layer and the transistor, wherein the second dielectric layer comprises a second opening exposing the portion of the first light-shielding layer and the first source/drain region of the transistor, and a second projection of the second opening on the substrate at least partially overlaps with a first projection of the first opening on the substrate;

forming a first conductive layer on the second dielectric layer, wherein the first conductive layer comprises a first portion covering the first opening and the second opening, and contacting the source/drain region of the active layer and the first light-shielding layer;

forming a third dielectric layer on the first conductive layer, wherein the third dielectric layer comprises a third opening exposing the first portion of the first conductive layer, and wherein a third projection of the third opening on the substrate at least partially overlaps with the first projection and the second projection;

forming a fourth dielectric layer on the third dielectric layer, wherein the fourth dielectric layer comprises a fourth opening exposing the first portion of the first conductive layer, and wherein a fourth projection of the fourth opening on the substrate at least partially overlaps with the first projection of the first opening, the second projection of the second opening, and the third projection of the third opening; and forming a second conductive layer on the fourth dielectric layer, wherein the second conductive layer covers the third opening and the fourth opening, and contacts the first portion of the first conductive layer.

15. The method according to claim 14, wherein the second dielectric layer further comprises a fifth opening exposing the second source/drain region of the active layer.

16. The method according to claim 15, wherein the first conductive layer further comprises a second portion covering the second opening, and contacting the second source/drain region of the active layer.

17. The method according to claim 16, wherein forming the transistor comprises: forming a gate insulating layer located on the active layer and a gate layer located on the gate insulating layer, and wherein the gate layer and the gate insulating layer are located on a side of the active layer away from the substrate.

18. The method according to claim 17, wherein the active layer comprises an exposed portion located between the first portion of the first conductive layer and the gate layer along a direction parallel to the substrate, and the method further comprises:

forming a second light-shielding layer between the third dielectric layer and the fourth dielectric layer, and a projection of the exposed portion of the active layer on the substrate at least partially overlaps with a projection of the second light-shielding layer on the substrate.

19. The method according to claim 18, wherein the second light-shielding layer comprises a red color film layer.

20. The method according to claim 14, wherein the first light-shielding layer is a metal layer;

wherein the first dielectric layer is a buffer layer, the second dielectric layer is an interlayer dielectric layer, the third dielectric layer is a passivation layer, and the fourth dielectric layer is a pixel defining layer;

wherein the active layer comprises an indium gallium zinc oxide material; and wherein the second conductive layer comprises an anode layer of a light-emitting device.

* * * * *